US011213891B2

(12) United States Patent
Abeshaus et al.

(10) Patent No.: US 11,213,891 B2
(45) Date of Patent: Jan. 4, 2022

(54) SEMICONDUCTOR MANUFACTURING DEVICE WITH EMBEDDED FLUID CONDUITS

(71) Applicant: Varian Semiconductor Equipment Associates, Inc., Gloucester, MA (US)

(72) Inventors: Joshua M. Abeshaus, Salem, MA (US); Jordan B. Tye, Arlington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 324 days.

(21) Appl. No.: 16/540,801

(22) Filed: Aug. 14, 2019

(65) Prior Publication Data

US 2019/0366436 A1  Dec. 5, 2019

Related U.S. Application Data

(62) Division of application No. 14/692,189, filed on Apr. 21, 2015, now Pat. No. 10,486,232.

(51) Int. Cl.
| | |
|---|---|
| *H01J 37/317* | (2006.01) |
| *B22F 10/20* | (2021.01) |
| *B33Y 10/00* | (2015.01) |
| *B33Y 80/00* | (2015.01) |
| *B22F 5/00* | (2006.01) |

(52) U.S. Cl.
CPC ............. *B22F 10/20* (2021.01); *B33Y 10/00* (2014.12); *B33Y 80/00* (2014.12); *H01J 37/3171* (2013.01); *B22F 2005/005* (2013.01); *H01J 2237/002* (2013.01);

(Continued)

(58) Field of Classification Search
None
See application file for complete search history.

(56) References Cited

U.S. PATENT DOCUMENTS

| | | | | |
|---|---|---|---|---|
| 3,056,071 A | * | 9/1962 | Baker | ........................ H01F 6/06 |
| | | | | 335/300 |
| 3,394,254 A | * | 7/1968 | Le Poole | .............. H01J 37/141 |
| | | | | 250/399 |

(Continued)

FOREIGN PATENT DOCUMENTS

| | | |
|---|---|---|
| CN | 101175389 A | 5/2008 |
| CN | 102069172 A | 5/2011 |

(Continued)

*Primary Examiner* — Jacob J Cigna
(74) *Attorney, Agent, or Firm* — Kacvinsky Daisak Bluni PLLC

(57) ABSTRACT

Provided herein are approaches for forming a conduit embedded within a component of a semiconductor manufacturing device (e.g., an ion implanter) using an additive manufacturing process (e.g., 3-D printing), wherein the conduit is configured to deliver a fluid throughout the component to provide heating, cooling, and gas distribution thereof. In one approach, the conduit includes a set of raised surface features formed on an inner surface of the conduit for varying fluid flow characteristics within the conduit. In another approach, the conduit may be formed in a helical configuration. In another approach, the conduit is formed with a polygonal cross section. In another approach, the component of the ion implanter includes at least one of an ion source, a plasma flood gun, a cooling plate, a platen, and/or an arc chamber base.

20 Claims, 10 Drawing Sheets

(52) U.S. Cl.
CPC . *H01J 2237/0041* (2013.01); *H01J 2237/061* (2013.01); *H01J 2237/2001* (2013.01); *Y02P 10/25* (2015.11)

(56) References Cited

U.S. PATENT DOCUMENTS

| | | | |
|---|---|---|---|
| 3,707,628 A * | 12/1972 | Bassett | H01J 37/141 |
| | | | 250/311 |
| 4,593,261 A * | 6/1986 | Forster | H01F 27/10 |
| | | | 335/299 |
| 4,896,130 A * | 1/1990 | Ermilov | H01F 7/20 |
| | | | 335/300 |
| 5,012,104 A * | 4/1991 | Young | H01J 37/1475 |
| | | | 250/396 ML |
| 5,136,166 A * | 8/1992 | Young | H01J 37/1475 |
| | | | 250/396 ML |
| 5,289,009 A | 2/1994 | Bakker et al. | |
| 5,382,800 A * | 1/1995 | Nishino | H01J 37/1472 |
| | | | 250/396 ML |
| 6,015,008 A | 1/2000 | Kogure et al. | |
| 6,053,241 A * | 4/2000 | Kendall | F28F 13/00 |
| | | | 165/104.33 |
| 6,163,241 A * | 12/2000 | Stupak, Jr. | H01F 13/003 |
| | | | 335/216 |
| 7,345,287 B2 * | 3/2008 | Jasinski | H01J 37/141 |
| | | | 165/104.33 |
| 7,938,577 B2 * | 5/2011 | Takahashi | G05D 23/1919 |
| | | | 374/147 |
| 8,044,368 B2 * | 10/2011 | Adamec | H01J 37/141 |
| | | | 250/396 ML |
| 8,292,524 B1 | 10/2012 | Yu | |
| 9,448,014 B2 * | 9/2016 | Tsubokawa | H01J 37/32715 |
| 9,777,972 B2 * | 10/2017 | Da Conceicao Rosa | |
| | | | H02K 41/031 |
| 9,863,710 B2 * | 1/2018 | Kise | F28D 9/0062 |
| 9,909,215 B2 * | 3/2018 | Holber | H01J 37/32458 |
| 10,480,873 B2 * | 11/2019 | Ito | H01L 21/6838 |
| 2004/0040664 A1 * | 3/2004 | Yang | H01L 21/68785 |
| | | | 156/345.51 |
| 2004/0144931 A1 | 7/2004 | Harris | |
| 2011/0036538 A1 | 2/2011 | Brunschwiler et al. | |
| 2012/0292524 A1 | 11/2012 | Wieland et al. | |
| 2013/0062333 A1 | 3/2013 | Enami | |
| 2013/0233526 A1 | 9/2013 | Hisiop | |
| 2014/0145581 A1 | 5/2014 | Jerez et al. | |
| 2014/0367583 A1 | 12/2014 | Barrachlough et al. | |
| 2015/0047817 A1 * | 2/2015 | Kise | F28F 3/086 |
| | | | 165/157 |
| 2015/0047935 A1 | 2/2015 | Godfrey et al. | |
| 2015/0062813 A1 | 3/2015 | Honsberg-Riedl et al. | |
| 2015/0090898 A1 | 4/2015 | Futter et al. | |
| 2020/0398385 A1 * | 12/2020 | Alahyari | F28D 15/0266 |
| 2021/0080195 A1 * | 3/2021 | Kupiszewski | F28F 13/187 |

FOREIGN PATENT DOCUMENTS

| | | |
|---|---|---|
| CN | 103495734 A | 1/2014 |
| CN | 203509037 U | 4/2014 |
| CN | 104089300 A | 10/2014 |
| JP | S57-089256 U | 6/1982 |
| JP | H1012180 A | 1/1998 |
| JP | 2000223494 A | 8/2000 |
| JP | 2005528790 A | 9/2005 |
| JP | 2005291599 A | 10/2005 |
| JP | 2014011313 A | 1/2014 |
| WO | 2013179936 A1 | 5/2013 |
| WO | 2013171216 A1 | 11/2013 |
| WO | 2014143775 A1 | 9/2014 |
| WO | 2014191129 A1 | 12/2014 |

* cited by examiner

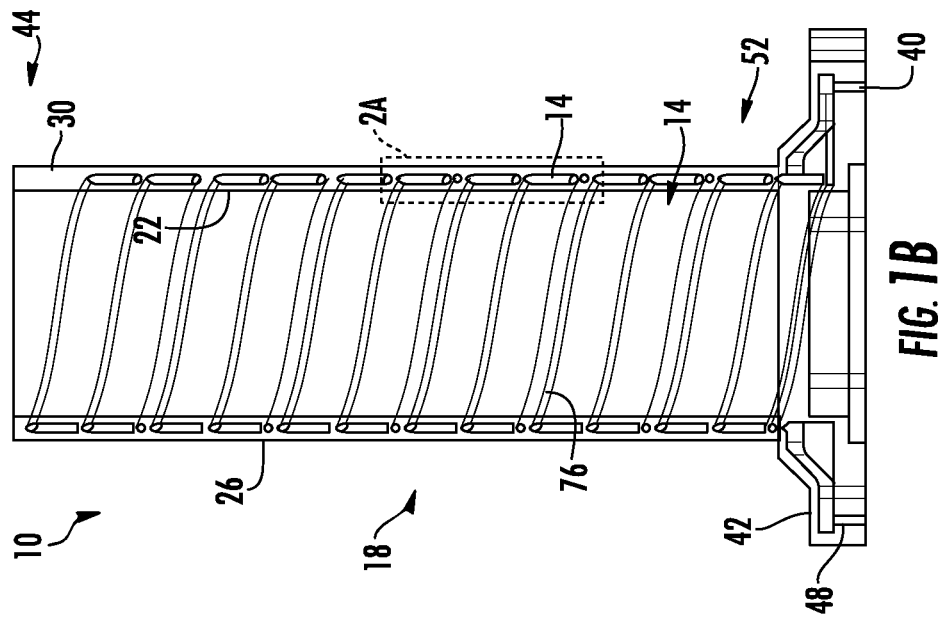
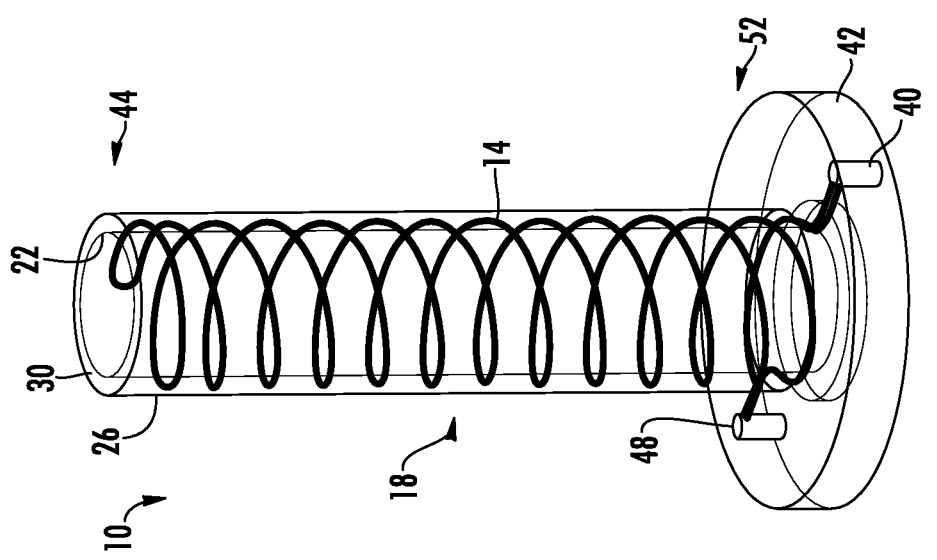

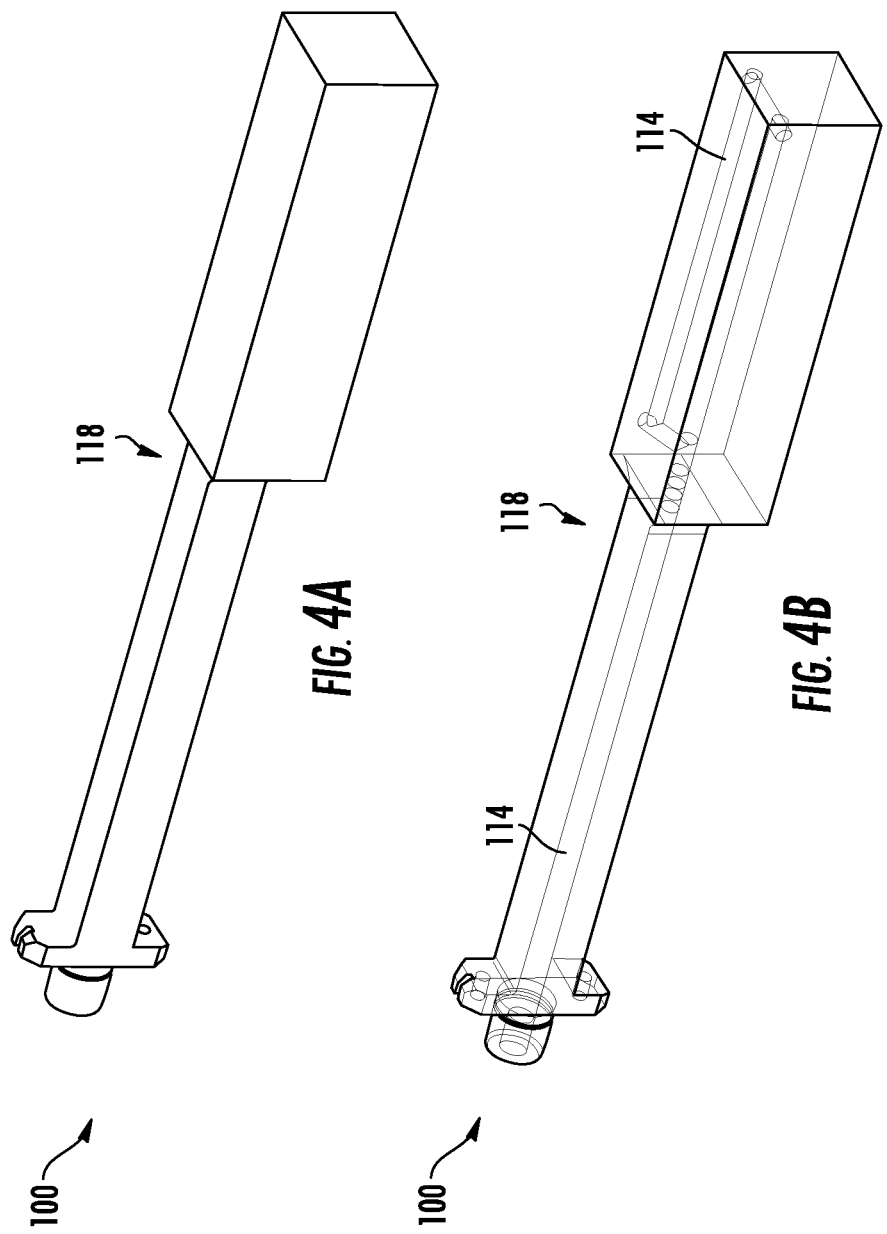

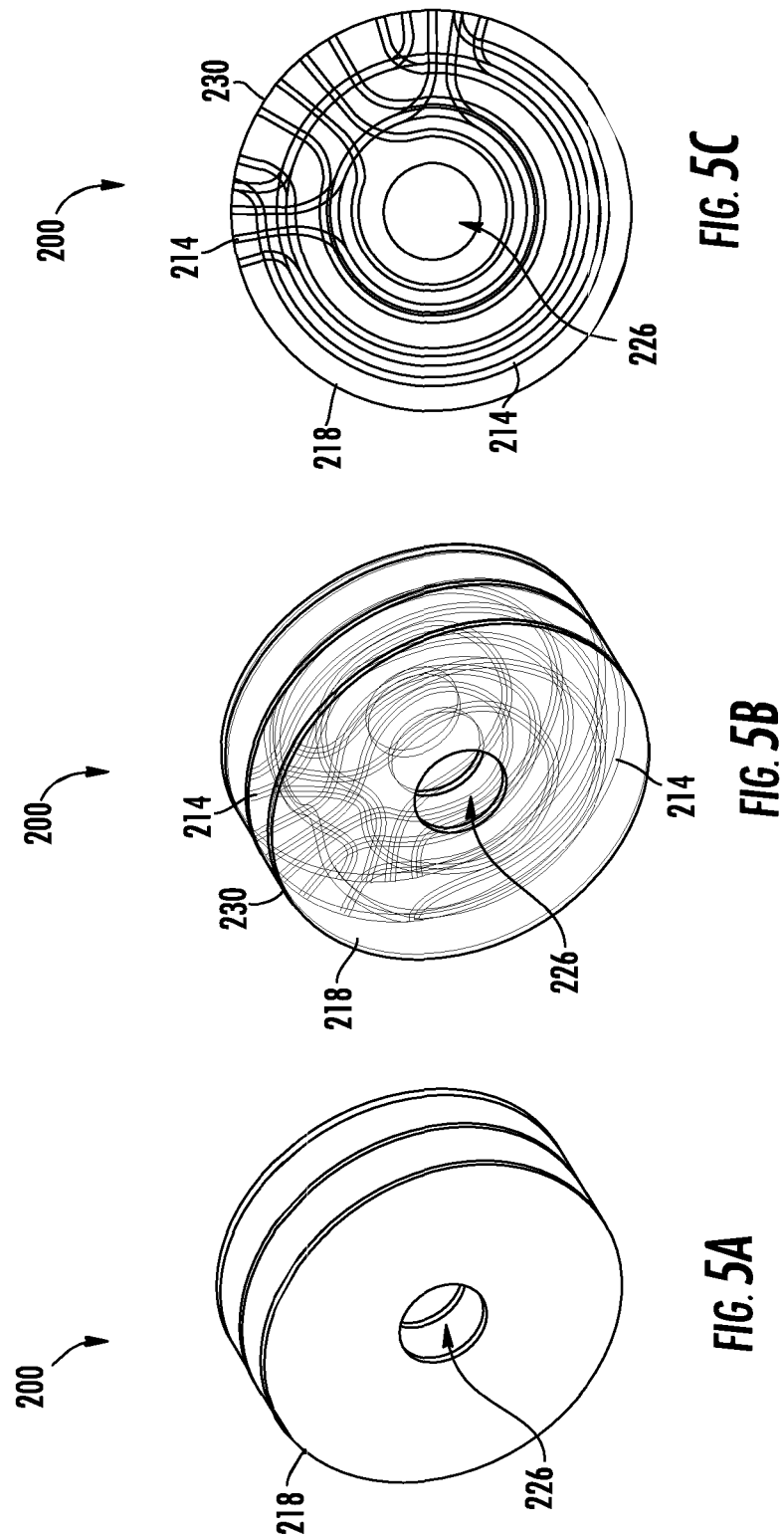

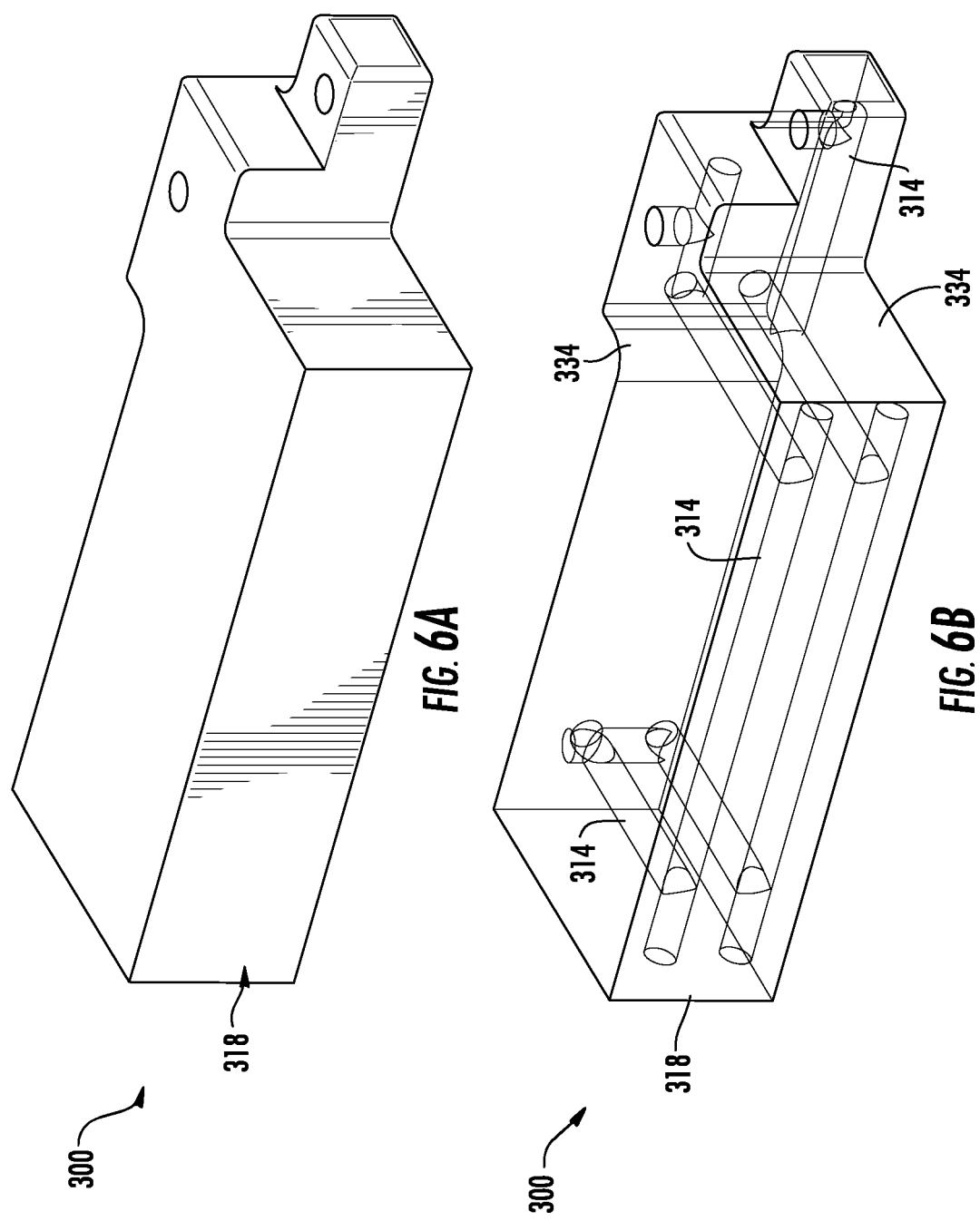

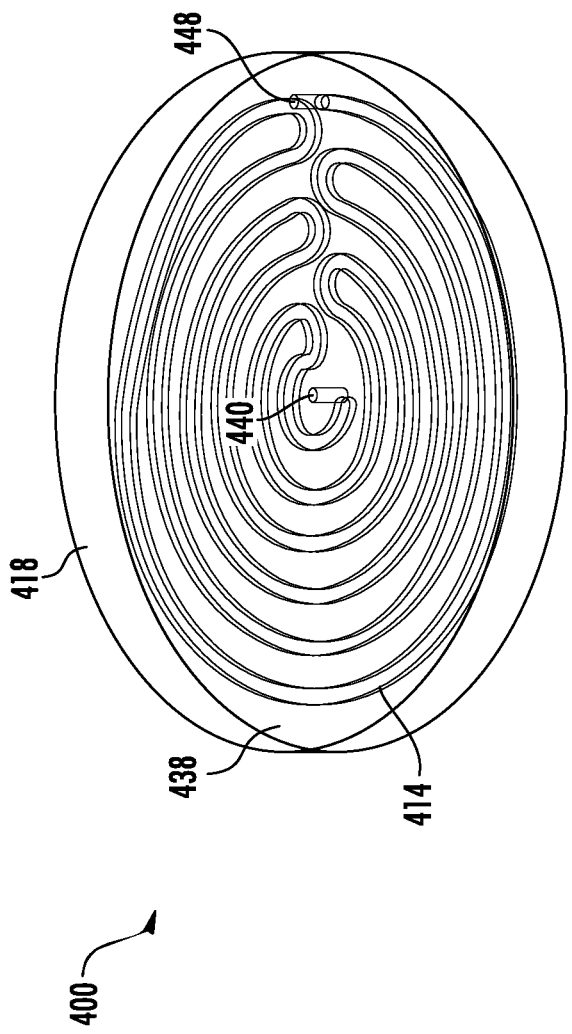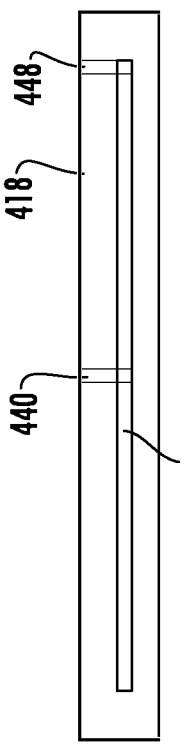
FIG. 7A
FIG. 7B

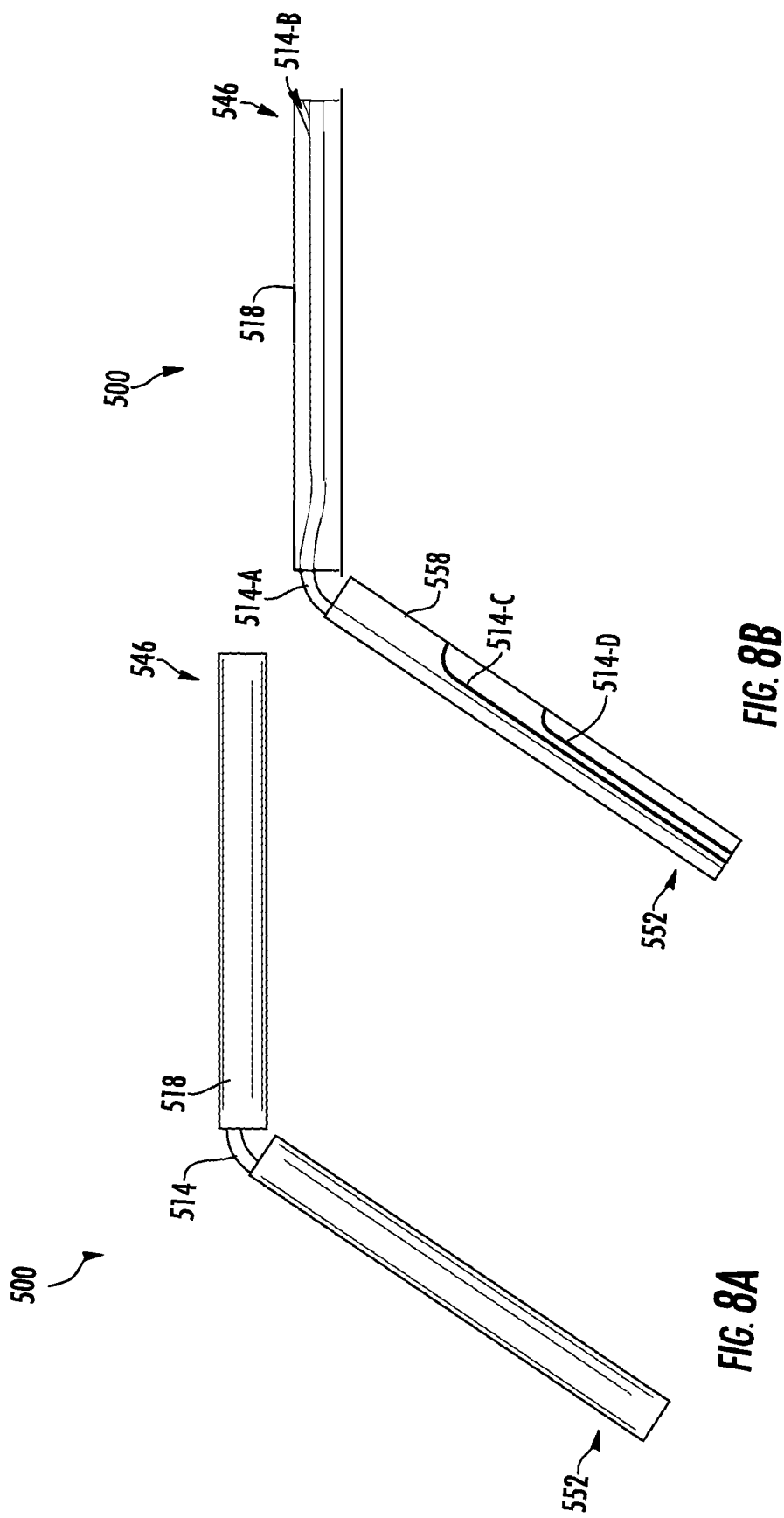

SEMICONDUCTOR MANUFACTURING DEVICE WITH EMBEDDED FLUID CONDUITS

CROSS-REFERENCE TO RELATED APPLICATION

This is a divisional of pending U.S. non-provisional patent application Ser. No. 14/692,189, filed Apr. 21, 2015, the entire contents of the application incorporated by reference herein.

FIELD OF THE DISCLOSURE

The disclosure relates generally to the field of semiconductor device fabrication and, more particularly, to a semiconductor manufacturing device having complex embedded fluid channels formed therein.

BACKGROUND OF THE DISCLOSURE

In semiconductor manufacturing, ion implantation is a common technique for altering properties of semiconductor wafers during the production of various semiconductor-based products. Ion implantation may be used to introduce conductivity-altering impurities (e.g., dopant implants), to modify crystal surfaces (e.g., pre-amorphization), to created buried layers (e.g., halo implants), to create gettering sites for contaminants, and to create diffusion barriers (e.g., fluorine and carbon co-implant). Also, ion implantation may be used in non-transistor applications such as for alloying metal contact areas, in flat panel display manufacturing, and in other surface treatment. All of these ion implantation applications may be classified, generally, as forming a region of material property modification.

In a typical doping process, a desired impurity material is ionized, the resulting ions are accelerated to form an ion beam of a prescribed energy, and the ion beam is directed at a surface of a target substrate, such as a semiconductor-based wafer. Energetic ions in the ion beam penetrate into bulk semiconductor material of the wafer and are embedded into a crystalline lattice of the semiconductor material to form a region of desired conductivity.

An ion implanter usually includes an ion source for generating ions. Ion sources generate a large amount of heat during operation. The heat is a product of the ionization of a working gas, which results in a high-temperature plasma in the ion source. To ionize the working gas, a magnetic circuit is configured to produce a magnetic field in an ionization region of the ion source. The magnetic field interacts with a strong electric field in the ionization region, where the working gas is present. The electrical field is established between a cathode, which emits electrons, and a positively charged anode, and the magnet circuit is established using a magnet and a pole piece made of magnetically permeable material. The sides and base of the ion source are other components of the magnetic circuit. In operation, the ions of the plasma are created in the ionization region and are then accelerated away from the ionization region by the induced electric field.

The magnet, however, is a thermally sensitive component, particularly in the operating temperature ranges of a typical ion source. For example, in typical end-Hall ion sources cooled solely by thermal radiation, discharge power is typically limited to about 1000 Watts, and ion current is typically limited to about 1.0 Amps to prevent thermal damage particularly to the magnet. To manage higher discharge powers, and therefore higher ion currents, direct anode cooling systems have been developed to reduce the amount of heat reaching the magnet and other components of an ion source.

One such anode cooling system includes coolant lines running to and pumping coolant through a hollow anode. Specifically, material from the ion source is removed (e.g., using a subtractive manufacturing process) to form two axial conduits along a length of the sidewall of the ion source, wherein the axial conduits may be spaced 180 degrees apart. Unfortunately, this axial conduit configuration limits the ability to provide uniform cooling throughout the ion source.

SUMMARY

In view of the foregoing, it would be advantageous to provide a method for forming a conduit embedded within a component of a semiconductor manufacturing device using an additive manufacturing process. Moreover, it would be advantageous to provide such a device and method including heating or cooling conduits having complex shapes, profiles, cross-sections, surface textures, etc., to provide enhanced heating or cooling of a component when fluid flows through the conduits.

An exemplary method in accordance with the present disclosure may include forming a conduit embedded within a component of a semiconductor manufacturing device using an additive manufacturing process, the conduit including a set of raised features formed on an inner surface of the conduit.

An exemplary method in accordance with the present disclosure may include forming a conduit embedded within a component of a semiconductor manufacturing device using an additive manufacturing process, the conduit including a set of raised surface features formed on an inner surface of the conduit. The set of raised surface features may extend into an interior area of the conduit.

An exemplary semiconductor manufacturing device in accordance with the present disclosure may include a conduit embedded within a component of the semiconductor manufacturing device, the conduit formed with a plurality of undulations. The ion implanter may further include a set of raised surface features formed on an inner surface of the conduit, the set of raised surface features extending into an interior area of the conduit.

BRIEF DESCRIPTION OF THE DRAWINGS

FIG. 1A is an isometric semi-transparent view illustrating a component of a semiconductor manufacturing device in accordance with the present disclosure.

FIG. 1B is a side view illustrating the component of the ion implanter shown in FIG. 1A.

FIG. 4A is an isometric view illustrating another component of a semiconductor manufacturing device in accordance with the present disclosure.

FIG. 4B is an isometric semi-transparent view illustrating the component of the ion implanter shown in FIG. 4A.

FIG. 5A is an isometric view illustrating another component of a semiconductor manufacturing device in accordance with the present disclosure.

FIG. 5B is an isometric semi-transparent view illustrating the component of the ion implanter shown in FIG. 5A.

FIG. 5C is a side view illustrating the component of the ion implanter shown in FIG. 5B.

FIG. 6A is an isometric view illustrating another component of a semiconductor manufacturing device in accordance with the present disclosure.

FIG. 6B is an isometric semi-transparent view illustrating the component of the ion implanter shown in FIG. 6A.

FIG. 7A is an isometric semi-transparent view illustrating another component of a semiconductor manufacturing device in accordance with the present disclosure.

FIG. 7B is a side view illustrating the component of the ion implanter shown in FIG. 7A.

FIG. 8A is an isometric view illustrating another component of a semiconductor manufacturing device in accordance with the present disclosure.

FIG. 8B is an isometric semi-transparent view illustrating the component of the ion implanter shown in FIG. 8A.

Figure 2B:
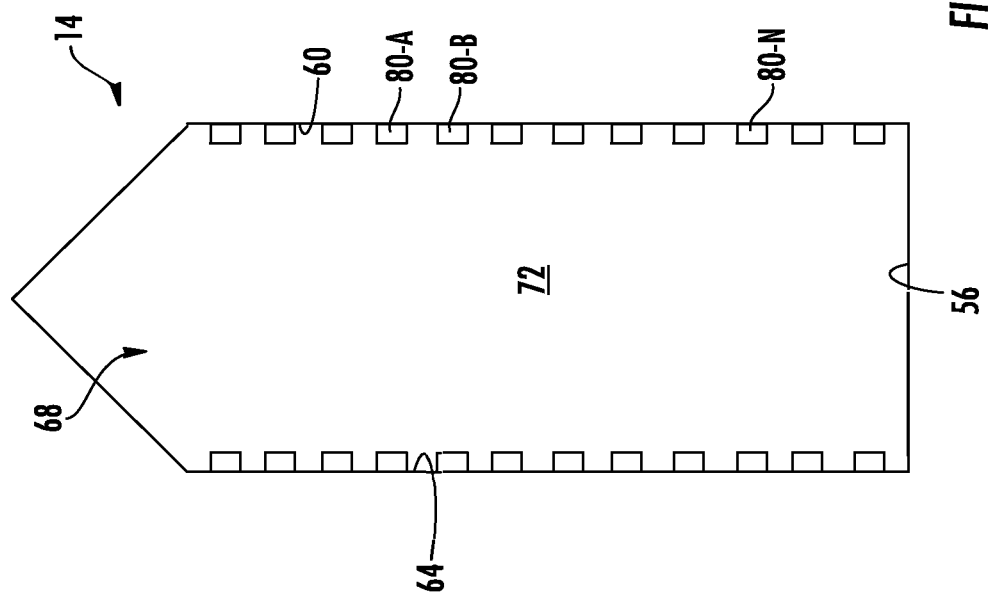
FIG. 2B is a side view illustrating the conduit within the component of the ion implanter shown in FIG. 1A.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

DETAILED DESCRIPTION

A device and method in accordance with the present disclosure will now be described more fully hereinafter with reference to the accompanying drawings, in which embodiments of the device and method are shown. The device and method, however, may be embodied in many different forms and should not be construed as being limited to the embodiments set forth herein. Rather, these embodiments are provided so that this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as it appears in the figures. Said terminology will include the words specifically mentioned, derivatives thereof, and words of similar import.

As used herein, an element or operation recited in the singular and proceeded with the word "a" or "an" should be understood as not excluding plural elements or operations, unless such exclusion is explicitly recited. Furthermore, references to "one embodiment" of the present disclosure are not intended to be interpreted as excluding the existence of additional embodiments that also incorporate the recited features.

As stated above, provided herein are approaches for forming a conduit embedded within a component of a semiconductor manufacturing device (e.g., an ion implanter) using an additive manufacturing process (e.g., 3-D printing), wherein the conduit is configured to deliver a fluid throughout the component to provide heating, cooling, or gas distribution thereof. In one approach, the conduit includes a set of raised surface features formed on an inner surface of the conduit for varying fluid flow characteristics within the conduit.

An ion implanter disclosed herein may include one or more components formed using an additive manufacturing process, such as 3-D printing. In particular, the present disclosure relates to a system and process for printing 3-D features in a layer-by-layer manner from digital representations of the 3-D component (e.g., additive manufacturing file format (AMF) and stereolithography (STL) file format) using one or more additive manufacturing techniques. Examples of additive manufacturing techniques include extrusion-based techniques, jetting, selective laser sintering, powder/binder jetting, electron-beam melting, and stereolithographic processes. For each of these techniques, the digital representation of the 3-D part is initially sliced into multiple horizontal layers. For each sliced layer, a tool path is then generated, which provides instructions for the particular additive manufacturing system to print the given layer.

In one example, components of the present disclosure may be formed using an extrusion-based additive manufacturing system in which a 3-D component may be printed from a digital representation of the 3-D component in a layer-by-layer manner by extruding a flowable part material. The part material is extruded through an extrusion tip carried by a print head of the system, and is deposited as a sequence of roads on a platen in planar layers. The extruded part material fuses to previously deposited part material, and solidifies upon a drop in temperature. The position of the print head relative to the substrate is then incremented, and the process is repeated to form a 3-D part resembling the digital representation.

In another example, components of the present disclosure may be formed via fused deposition modeling (FDM), which places the material in layers. A plastic filament or metal wire may be unwound from a coil and placed in order to produce a component. FDM further involves a computer processing a STL file for the component. During operation, FDM employs a nozzle to extrude beads of material. The nozzle may be heated to melt the material or otherwise make the material more pliable. An extrusion head may be coupled to the nozzle for depositing the beads. The nozzle may be movable in horizontal and vertical directions. The nozzle may be controlled by a robotic mechanism, for example a robotic mechanism having a rectilinear design or a delta robot. The extrusion head may be moved by stepper motors, servo motors, or other types of motors. The nozzle and extrusion head may be controllable by the computer, which may, for example, send control directives to the robotic mechanism and the motor.

In yet another example, components of the present disclosure are formed using a selective laser sintering (SLS) process. SLS may involve the use of a laser, for example, a carbon dioxide laser, to fuse particles of a material into a desired three-dimensional shape. Example materials may include plastics, metals, and ceramics. SLS may be applied using several materials, for example, using layers of different material or by mixing different materials together. Materials may include polymers such as nylon (neat, glass-filled, or with other fillers) or polystyrene, metals including steel, titanium, alloy mixtures, and composites and green sand. The materials may be in the form of a powder.

SLS may involve using the laser to selectively fuse material by scanning cross-sections generated from a 3-D digital description of the component (for example, from a CAD file) on the surface of a powder bed. After each cross-section is scanned, the powder bed may be lowered based on a predetermined layer thickness, a new layer of material may be applied on top, and the process is repeated. This may continue until the component is fully fabricated.

In fabricating 3-D parts by depositing layers of a part material, supporting layers or structures may be built underneath overhanging portions or in cavities of 3-D parts under construction, which are not supported by the part material itself. A support structure may be built utilizing the same deposition techniques by which the part material is deposited. The host computer generates additional geometry acting as a support structure for the overhanging or free-space segments of the 3-D part being formed. The support material is then deposited pursuant to the generated geometry during the printing process. The support material adheres to the part material during fabrication, and is removable from the completed 3-D part when the printing process is complete.

Referring now to FIGS. 1A-1B, an exemplary embodiment demonstrating a portion of a semiconductor manufacturing device (e.g., an ion implanter 10) in accordance with the present disclosure is shown. The ion implanter 10 includes a conduit 14 embedded within a component 18 (e.g., an ion source) of the ion implanter 10, the conduit 14 described herein as being used for distribution of liquid and/or gas throughout the component 18 to provide heating, cooling, or gas distribution thereof.

As shown, the conduit 14 is located between an interior surface 22 and an exterior surface 26 of a sidewall 30 of the component 18, and represents, for example, embedded cooling channels for an ion source. The conduit 14 may extend along the sidewall 30, taking gas or liquid from an inlet 40 located within a base section 42 and deliver it to a distal end 44 of the component 18. The conduit 14 may then take the gas or liquid to an outlet 48 located at a proximal end 52 of the component 18. As shown, the conduit 14 may be formed in a helical configuration, and may extend 360° about the component 18. Forming the conduit 14 as a helix enables the fluid to be more evenly distributed through the component 18, thus reducing the occurrence of disparate temperature variants. In other embodiments, the conduit 14 may be formed with a plurality of undulations, curves, etc., or virtually any other imaginable configuration. In various embodiments, the gas or liquid may be used as a coolant, examples of which include xenon (Xe), argon (Ar), oil, or water.

As stated above, the component 18 may be formed using an additive manufacturing process (e.g., 3-D printing) that enables conduit geometries to be embedded into solid components not feasible using traditional subtractive manufacturing techniques, such as drilling. 3-D printing allows not only simple, straight, circular channels, but complex paths and profiles in any material, which permits ideal geometries to be fabricated.

In the embodiment shown in FIGS. 1A-B, the complex profiled helical configuration of the conduit 14 can be inlayed within the component 18 during formation of the component using an additive manufacturing process. The conduit 14 may have a unique cross sectional profile suited to the desired application, which can include, but is not limited to, heating, cooling, and gas distribution.

Figure 2A:
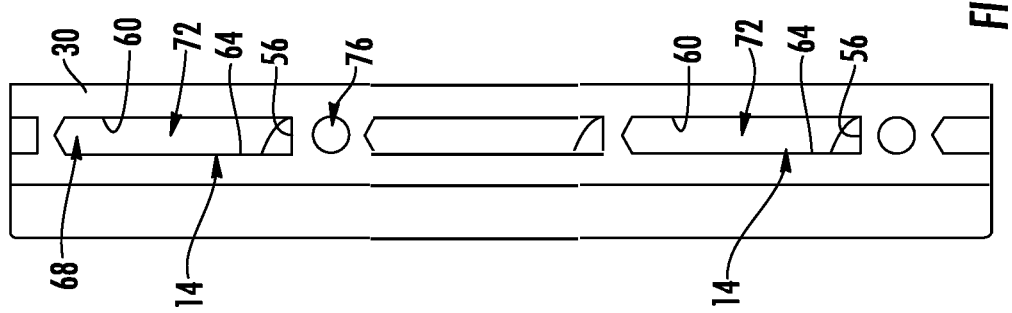
FIG. 2A is a cross-sectional view illustrating a conduit within the component of the ion implanter shown in FIG. 1A.

One such non-limiting application is an inlayed water-cooling channel with a pentagonal cross section, as shown in FIGS. 1B and 2A-B. In this embodiment, the pentagonal cross section of the conduit 14 is defined by a bottom surface 56, a set of sidewalls 60, 64, and a generally triangular-shaped top portion 68. The conduit 14 further defines an interior area 72 in which a fluid flows. The pentagonal cross section of the conduit 14 maximizes performance versus, for example, a circular cross sectioned conduit because the flat, thin cross sectional geometry of the sidewalls 60, 64 of the pentagonal conduit 14 provides greater heat transfer between the plasma within the component 18 and the fluid flowing through the conduit 14. Although shown in this embodiment as a pentagon for the sake of illustration, it will be appreciated that virtually any imaginable cross section for conduit 14 is possible. This includes, but is not limited to, any regular or irregular polygon, for example, a triangle, a star, a crescent moon, a trapezoid, a crown, a rectangular, a hexagon, etc.

In another non-limiting embodiment, as further shown in FIGS. 1B-2A, the component 18 may include a plurality of conduits. That is, in addition to the conduit 14, the component 18 may further include a circular cross sectioned channel 76 formed in the sidewall 30 for delivering gas to the ion source. As shown, the channel 76 follows and extends along a portion of the conduit 14. In exemplary embodiments, the channel 76 is similarly formed using one or more additive manufacturing processes.

Referring now to FIG. 2B, a set of surface features formed along the conduit 14 using an additive manufacturing process is shown. In exemplary embodiments, surface features, such as raised surface features 80A-N, may be selected to control the flow properties of the fluid through the conduit 14, thus effecting thermal performance of a cooled or heated fluid. As shown, the conduit 14 includes the set of raised surface features 80A-N formed on an inner surface (e.g., sidewalls 60, 64) of the conduit 14, wherein the set of raised surface features 80A-N extend into the interior area 72 of the conduit 14 to affect flow properties of a fluid flowing therein. The raised surface features 80A-N may be formed along sidewalls 60 and 64, as shown, and/or along the bottom surface 56 in other embodiments.

In exemplary embodiments, the raised surface features 80A-N may be formed during the fabrication of the component 18, e.g., using an additive manufacturing process. As such, the raised surface features 80A-N may include any number of surface feature geometries and complexities to generate a desired fluid flow (e.g., turbulent flow or smooth, laminar flow), which may not be feasible using subtractive manufacturing techniques. In another embodiment, a plating could be applied to one or more surfaces of the conduit 14 after fabrication to change the surface roughness and thus change the flow.

Figure 3B:
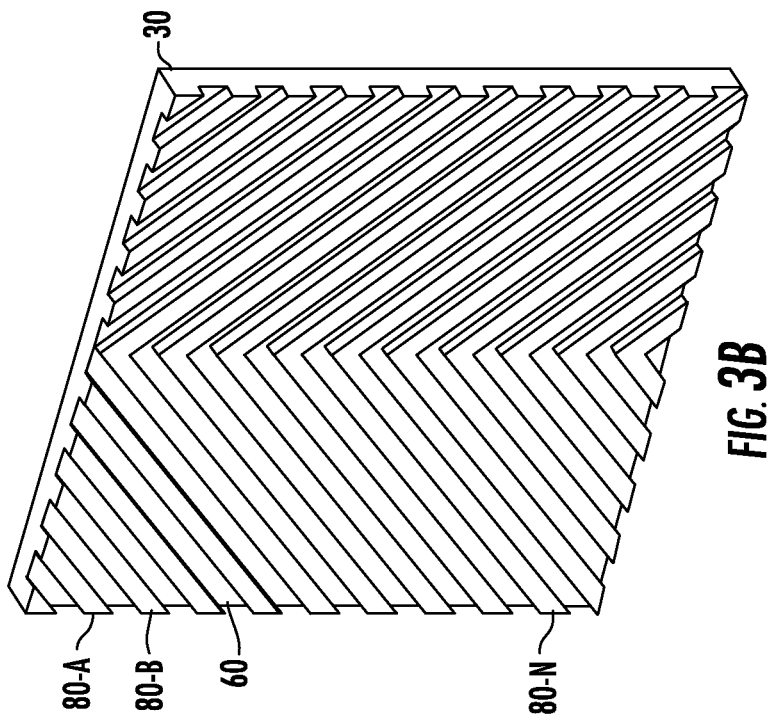
FIGS. 3A-3-D are isometric view illustrating various raised surface features formed along a surface of the conduit within the component of the ion implanter shown in FIG. 1A.
Figure 3A:
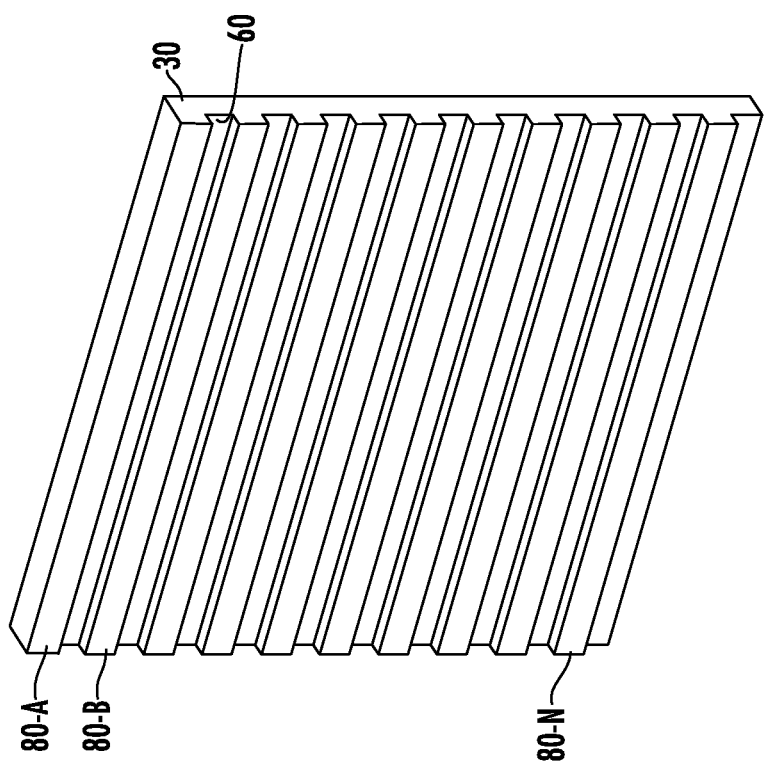

In one non-limiting embodiment, as shown in FIGS. 2B and 3A, the raised surface features 80A-N correspond to a plurality of uniformly patterned ridges formed on the inner sidewall 60 and are oriented generally parallel to a flow of fluid through the conduit 14. In this embodiment, each of the plurality of ridges extends into the interior area 72 of the conduit 14, and has a generally rectangular cross section. The ridges can be either parallel or normal to the direction of flow, and may be used for directing flow, modifying the flow/direction, and changing the effective surface roughness. Changing the surface roughness may cause eddy's to form, creating a more turbulent flow.

In another non-limiting embodiment, as shown FIG. 3B, the raised surface features 80A-N correspond to a plurality of uniformly patterned ridges formed on the inner surface 60 and are configured in an angled or V-shaped pattern. In this embodiment, each of the plurality of ridges extends into the interior area 72 (FIG. 2B) of the conduit 14, and has a generally rectangular cross section.

Figure 3D:
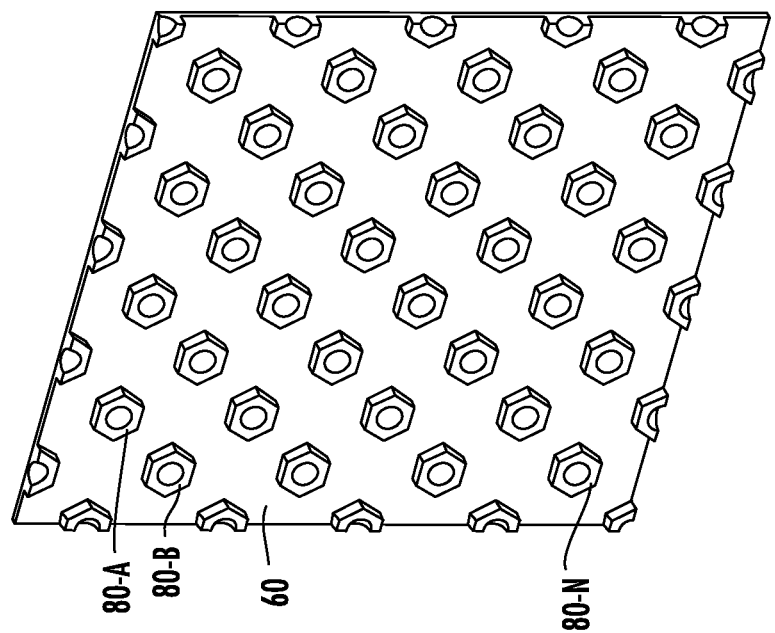
Figure 3C:
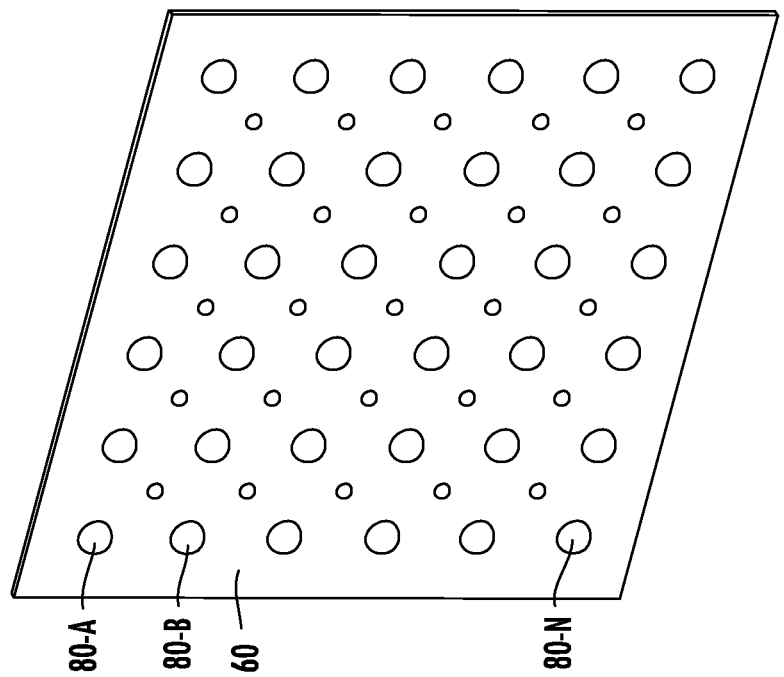

In other non-limiting embodiments, as shown FIGS. 3C-D, the set of raised surface features 80A-N corresponds to a plurality protrusions formed on an inner surface of the conduit 14, for example, sidewall 60. The protrusions may have a semi-circular profile (e.g., as shown in FIG. 3C) or a hexagonal profile (e.g., as shown in FIG. 3-D). In each embodiment, the plurality of protrusions extend into the interior area 72 (FIG. 2B) of the conduit 14, and are provided to generate turbulence in the fluid within the conduit 14. The protrusions may be used for directing flow, modifying the flow/direction, and changing the effective surface roughness. Changing the surface roughness may cause eddy's to form, creating a more turbulent flow. Additionally, each protrusion may be an activation site for a chemical reaction, or a sensing site for detecting one or more conditions of the fluid.

Referring now to FIGS. 4A-4B, an exemplary embodiment demonstrating a portion of an ion implanter 100 in accordance with another aspect of the present disclosure is shown. The ion implanter 100 includes a conduit 114 embedded within a component 118, which in this non-limiting embodiment corresponds to a plasma flood gun (PFG).

The PFG may be used within the ion implanter 100 to provide negative electrons for neutralizing positive ions in the beam. In particular, the PFG may typically be located near the platen close to the incoming ion beam just before it makes its impact on a wafer or target substrate. The PFG includes a plasma chamber 120, wherein a plasma is generated through ionization of atoms of an inert gas such as argon (Ar), xenon (Xe) or krypton (Kr). Low-energy electrons from the plasma are introduced into the ion beam and drawn towards the target wafer to neutralize the excessively positively charged wafer.

As shown in FIG. 4B, the embedded conduit 114 provides thermal control and gas distribution through the component 118. In exemplary embodiments, the embedded conduit 114 may provide more uniform thermal performance throughout the component 118, a more ideal gas distribution, a smaller envelope (i.e., smaller volumetric requirements, smaller geometry, smaller occupied volume/space), and a reduced number of parts, which reduces costs and is easier to manufacture. The embedded conduit 114 may also reduce potential contamination that results from having multiple parts assembled together. Similar to embodiments described above, the component 118 and the conduit are formed using an additive manufacturing processes. In various embodiments, the conduit 114 may include any number of cross sectional profiles and/or raised surface features, including any of those described above and shown in FIGS. 3A-3-D.

Referring now to FIGS. 5A-C, an exemplary embodiment demonstrating a portion of an ion implanter 200 in accordance with another aspect of the present disclosure is shown. The ion implanter 200 includes a plurality of conduits 214 embedded within a component 218, which in this non-limiting embodiment corresponds to a cooling plate for use with a magnet.

As discussed above, a magnet may be used within the ion implanter 200 to produce a magnetic field in an ionization region of the ion source. However, because the magnet is a thermally sensitive component, particularly in the operating temperature ranges of a typical ion source, a cooling plate may be attached thereto to reduce temperatures affecting the magnet.

As shown in FIGS. 5B-C, the cooling plate (i.e., component 218) includes a plurality of complex conduits 214 embedded within to provide increased cooling to the magnet. As shown, one or more conduits 214 encircle an inner opening 226 of the cooling plate, and extend to an outer perimeter 230. In this embodiment, multiple parallel pathways provide the desired cooling, while also limiting the pressure drop and net temperature increase of the coolant. Because the cooling plate may be formed as a single piece using an additive manufacturing processes, suboptimal thermal performance caused by an interface between components of the cooling plate is eliminated. Furthermore, the profile of the conduit 214 is not constrained by fabrication and laying of cooling tubes, which limits the number of feasible conduit configurations.

Referring now to FIGS. 6A-B, an exemplary embodiment demonstrating a portion of an ion implanter 300 in accordance with another aspect of the present disclosure is shown. The ion implanter 300 includes a plurality of conduits 314 embedded within a component 318, which in this non-limiting embodiment corresponds to an arc chamber base.

The arc chamber base may be in contact with an indirectly heated cathode (IHC) arc chamber defining a set of electrically conductive (e.g. tungsten) chamber walls 334 and an ionization zone within which energy is imparted to a dopant feed gas to generate associated ions. Different feed gases are supplied to the ion source chamber through the plurality of conduits 314 to obtain plasma used to form ion beams having particular dopant characteristics. For example, the introduction of $H_2$, $BF_3$, $GeF_4$, $PH_3$, and $AsH_3$ as the dopant gas at relatively high chamber temperatures are broken down into mono-atoms having low, medium and high implant energies. These ions are formed into a beam, which then passes through a source filter (not shown).

As shown in FIG. 6B, the conduits 314 may be embedded into the arc chamber base (i.e., component 318) to provide thermal control and gas distribution therein. The conduits 314 provide a more uniform thermal performance due to a more ideal gas distribution, particularly for materials difficult to machine using subtractive manufacturing techniques. The conduits 314 also provide a small envelope and require fewer overall parts, which reduces cost and is easier to manufacture. Similar to embodiments described above, the component 318, including the conduits 314, may be formed using an additive manufacturing processes. In some embodiments, the conduit 314 may include any number of cross sectional profiles and/or raised surface features, including any of those described above and shown in FIGS. 3A-3-D.

Referring now to FIGS. 7A-B, an exemplary embodiment demonstrating a portion of an ion implanter 400 in accordance with another aspect of the present disclosure is shown. The ion implanter 400 includes a plurality of conduits 414 embedded within a component 418, which in this non-limiting embodiment corresponds to a platen used to hold a wafer.

As shown, the conduit 414 may be formed on an interior surface 438 of the component 418, and represents, e.g., an embedded cooling channel. The conduit 414 may take gas or liquid from an inlet 440 and deliver it through the component 418 to an outlet 448. As shown in this non-limiting embodiment, the conduit 414 may be formed generally as a coil. Forming the conduit 14 in such a configuration enables the fluid to be more evenly distributed throughout the component 418, thus providing enhanced thermal management.

Similar to embodiments described above, the component 418 may be formed using an additive manufacturing processes. In the embodiment shown in FIGS. 7A-B, the complex coil configuration of conduit 414 can be formed at the same time as the component 418, for example, as a single piece. In some embodiments, the conduit 414 may include any number of cross sectional profiles and/or raised surface features, including any of those described above and shown in FIGS. 3A-3-D.

Referring now to FIGS. 8A-B, an exemplary embodiment demonstrating a portion of an ion implanter 500 in accordance with another aspect of the present disclosure is shown. The ion implanter 500 includes a plurality of conduits 514A-D embedded within a component 518, which in this non-limiting embodiment corresponds to an arm or connecting element.

As shown, complex profiled conduits 514A-D may be embedded into parts or pieces of a mechanism to allow thermal management, gas distribution, or cable management thereof in moving components, while avoiding the need to run additional tubing. In this example, the conduit 514-A may represent a cable conduit that extends from a proximal end 546 to a distal end 552 of the component 518. Conduit 514-B may represent a gas or thermal management conduit that also extends from the proximal end 546 to the distal end 552 of the component 518. Meanwhile, the conduits 514C-D may represent gas or thermal management conduits extending partially along the component 518 from the distal end 552 to respective exits through a sidewall 558. Similar to embodiments described above, the component 518, including each of the conduits 514A-D, may be formed using an additive manufacturing process. In some embodiments, the conduits 514A-D may include any number of cross sectional profiles and/or raised surface features, including any of those described above and shown in FIGS. 3A-3-D.

Figure 9:
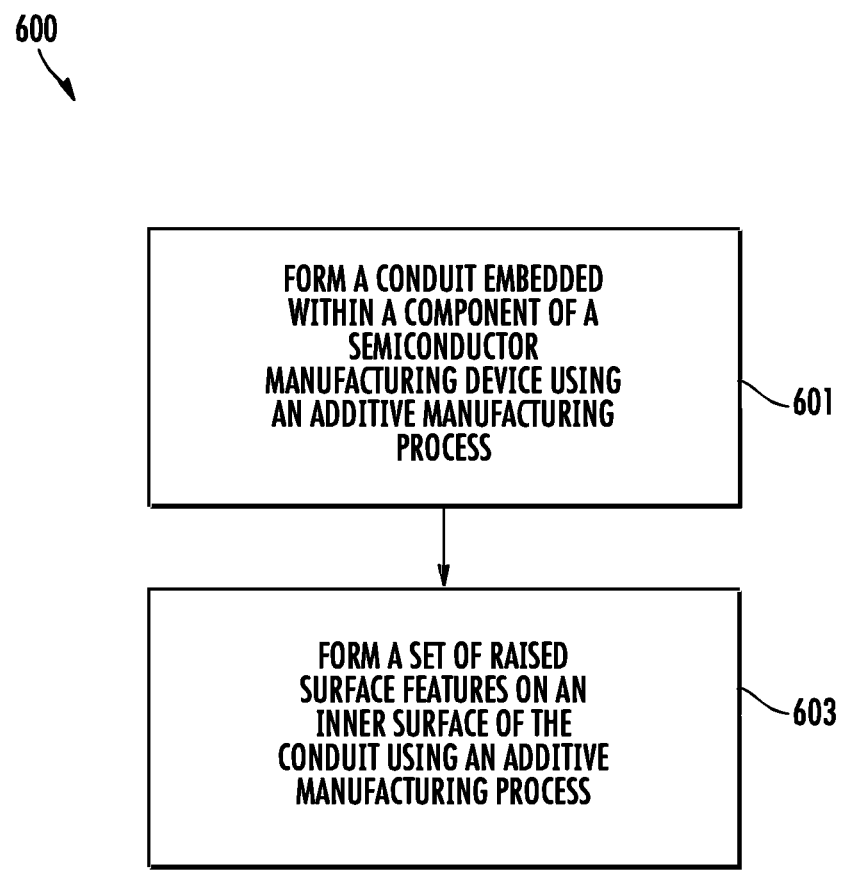
FIG. 9 is a flowchart illustrating an exemplary method according to the present disclosure.

Referring now to FIG. 9, a flow diagram illustrating an exemplary method 600 for forming a conduit embedded within a component of a semiconductor manufacturing device in accordance with the present disclosure is shown. The method 600 will be described in conjunction with the representations shown in FIGS. 1-8.

Method 600 includes forming a conduit embedded within a component of a semiconductor manufacturing device (e.g., an ion implanter) using an additive manufacturing process, as shown in block 601. In some embodiments, the conduit may be embedded within the component by one of: fused deposition modeling, an extrusion-based process, jetting, selective laser sintering, powder/binder jetting, electron-beam melting, and a stereolithographic process. In some embodiments, the conduit may be formed with a plurality of undulations, for example, in a helical configuration. In some embodiments, the conduit may be formed with a substantially polygonal cross section. In some embodiments, the conduit may be formed with a substantially pentagonal cross section. In some embodiments, a plurality of conduits may be formed within the component, wherein at least one of the plurality of conduits may have a substantially circular cross section. Method 600 further includes forming a set of raised surface features on an inner surface of the conduit using an additive manufacturing process, as shown in block 603. In some embodiments, the set of raised surface features may extend into an interior area of the conduit. In some embodiments, the set of raised features may include at least one of a plurality of protrusions and/or a plurality of ridges.

In view of the foregoing, at least the following advantages are achieved by the embodiments disclosed herein. Firstly, the conduits disclosed herein are formed in a solid object using an additive manufacturing process. As such, the conduits can be formed with complex shapes, profiles, and cross-sections that cannot be achieved using conventional subtractive manufacturing techniques (e.g., drilling). As a result, components may be designed closer to ideal geometries, which provides improved thermal performance of fluid systems. Secondly, additive manufacturing of the conduits disclosed herein enables more significant control of the surface finish and features thereof, which influences the flow properties of a fluid flowing therein. According to the disclosed embodiments, the internal surface features of the conduits can be formed during the fabrication of the component. These surface features can be varied to achieve desired flow characteristics (e.g., turbulent flow), and are not feasible using subtractive manufacturing techniques.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed is:

1. An ion source, comprising:
    a tubular component including a conduit embedded between an interior surface and an exterior surface of a sidewall, wherein the conduit includes a set of raised features formed on an inner surface of the conduit, and wherein the conduit has a pentagonal cross-section defined by a bottom surface, a set of sidewalls, and a substantially triangular-shaped top portion; and
    a base section including an inlet and an outlet, wherein the conduit is connected with the inlet and the outlet, and wherein the inlet, the outlet, and the conduit operate to deliver a cooling fluid.

2. The ion source of claim 1, the set of raised features extending into an interior area of the conduit.

3. The ion source of claim 1, the set of raised features including at least one of: a plurality of protrusions, and a plurality of ridges.

4. The ion source of claim 1, the conduit arranged as a helix extending around an entire circumference of the sidewall.

5. The ion source of claim 1, further comprising a second conduit embedded in the sidewall, the second conduit disposed adjacent the conduit.

6. The ion source of claim 5, wherein the second conduit has a circular cross-section.

7. The ion source of claim 5, wherein the second conduit is arranged as a helix extending around an entire circumference of the sidewall.

8. A semiconductor manufacturing device, comprising:
    a tubular component including a conduit embedded between an interior surface and an exterior surface of a sidewall, wherein the conduit includes a set of raised features formed on an inner surface of the conduit, and wherein the conduit has a pentagonal cross-section defined by a bottom surface, a set of sidewalls, and a substantially triangular-shaped top portion; and
    a base section coupled to the tubular component, the base section including an inlet and an outlet, wherein the conduit is connected with the inlet and the outlet, and wherein the inlet, the outlet, and the conduit operate to deliver a cooling fluid.

9. The semiconductor manufacturing device of claim 8, the set of raised features extending into an interior area of the conduit.

10. The semiconductor manufacturing device of claim 8, the set of raised features including at least one of: a plurality of protrusions, and a plurality of ridges.

11. The semiconductor manufacturing device of claim 8, the conduit arranged as a helix extending around an entire circumference of the sidewall.

12. The semiconductor manufacturing device of claim 8, further comprising a second conduit embedded in the sidewall, the second conduit disposed adjacent the conduit.

13. The semiconductor manufacturing device of claim 12, wherein the second conduit has a circular cross-section.

14. The semiconductor manufacturing device of claim 12, wherein the second conduit is arranged as a helix extending around an entire circumference of the sidewall.

15. An ion source, comprising:
- a tubular component including a conduit embedded between an interior surface and an exterior surface of a sidewall, wherein the conduit includes a set of raised features formed on an inner surface of the conduit, the set of raised features extending into an interior area of the conduit, and wherein the conduit has a pentagonal cross-section defined by a bottom surface, a set of sidewalls, and a substantially triangular-shaped top portion; and
- a base section coupled to the tubular component, the base section including an inlet and an outlet, wherein the conduit is fluidly connected with the inlet and the outlet, and wherein the inlet, the outlet, and the conduit operate to deliver a cooling fluid through the tubular component and the base section.

16. The ion source of claim 15, the set of raised features extending from the set of sidewalls.

17. The ion source of claim 15, the set of raised features including at least one of: a plurality of protrusions, and a plurality of ridges.

18. The ion source of claim 15, the conduit arranged as a helix extending around an entire circumference of the sidewall.

19. The ion source of claim 15, further comprising a second conduit embedded in the sidewall, the second conduit disposed adjacent the conduit.

20. The ion source of claim 19, wherein the second conduit has a circular cross-section, and wherein the second conduit is arranged as a helix extending around an entire circumference of the sidewall.

* * * * *